United States Patent
Belke, Jr. et al.

[11] Patent Number: 5,976,391
[45] Date of Patent: Nov. 2, 1999

[54] CONTINUOUS FLEXIBLE CHEMICALLY-MILLED CIRCUIT ASSEMBLY WITH MULTIPLE CONDUCTOR LAYERS AND METHOD OF MAKING SAME

[75] Inventors: Robert Edward Belke, Jr., W. Bloomfield; Edward P. McLeskey, Waterford; John Trublowski, Troy; Alice Dawn Zitzmann, Belleville, all of Mich.

[73] Assignee: Ford Motor Company, Dearborn, Mich.

[21] Appl. No.: 09/006,213

[22] Filed: Jan. 13, 1998

[51] Int. Cl.⁶ ...................................................... B44C 1/22
[52] U.S. Cl. .................................. 216/13; 29/830; 29/847; 216/20
[58] Field of Search ..................... 216/13, 17–20; 29/829, 830, 846, 847, 844, 853

[56] References Cited

U.S. PATENT DOCUMENTS

| | | | |
|---|---|---|---|
| 2,926,340 | 2/1960 | Blain et al. ................................ | 365/55 |
| 3,305,416 | 2/1967 | Kahan et al. .............................. | 216/20 |
| 3,448,516 | 6/1969 | Buck ........................................ | 29/847 |
| 3,536,545 | 10/1970 | Traynor et al. ........................... | 216/19 |
| 3,728,177 | 4/1973 | Caule ....................................... | 216/20 |
| 3,728,178 | 4/1973 | Caule ....................................... | 216/20 |
| 3,772,776 | 11/1973 | Weisenberger ............................ | 29/830 |
| 3,801,388 | 4/1974 | Akiyama et al. ......................... | 216/20 |
| 4,048,005 | 9/1977 | Nakagome et al. ....................... | 216/33 |
| 4,052,787 | 10/1977 | Shaheen et al. .......................... | 29/827 |
| 4,395,459 | 7/1983 | Herschdorfer et al. ................... | 428/391 |
| 4,404,059 | 9/1983 | Livshits et al. ........................... | 216/17 |
| 4,447,519 | 5/1984 | Pritikin .................................... | 430/275.1 |
| 4,480,288 | 10/1984 | Gazdik et al. ............................ | 361/751 |
| 4,517,050 | 5/1985 | Johnson et al. ........................... | 216/18 |
| 4,517,051 | 5/1985 | Gazdik et al. ............................ | 216/18 |
| 4,584,767 | 4/1986 | Gregory ................................... | 29/848 |
| 4,659,425 | 4/1987 | Eggers et al. ............................. | 216/20 |
| 4,679,122 | 7/1987 | Belke, Jr. et al. ......................... | 361/792 |
| 4,735,676 | 4/1988 | Iwasa ....................................... | 216/18 |
| 4,997,517 | 3/1991 | Parthasarathi ............................ | 216/18 |
| 5,118,385 | 6/1992 | Kumar et al. ............................. | 216/18 |
| 5,220,723 | 6/1993 | Okada ...................................... | 29/830 |
| 5,258,094 | 11/1993 | Furui et al. ............................... | 216/20 |
| 5,433,819 | 7/1995 | McMeen .................................. | 216/20 |
| 5,709,805 | 1/1998 | Davis et al. .............................. | 216/18 |
| 5,819,401 | 10/1998 | Johannes et al. ......................... | 29/830 |
| 5,837,154 | 11/1998 | Okabe et al. ............................. | 216/14 |

*Primary Examiner*—William Powell
*Assistant Examiner*—Donald L. Champagne
*Attorney, Agent, or Firm*—Damian Porcari

[57] ABSTRACT

A method of manufacturing an improved multi-layer printed circuit assembly having at least two conductor patterns. The method includes providing a first layer having a first metal surface a second layer having a second metal surface. A thin flexible carrier is placed between the first and second layers. The first and second layers are attached to opposite surfaces of the carrier. The first and second metal surfaces are etched to form first and second conductor patterns. The conductor patterns form the electrical traces interconnecting components on an electronic circuit assembly. The first and second conductor patterns are electrically connected to form an electronic circuit assembly that includes electronic traces on both sides of the circuit board.

2 Claims, 6 Drawing Sheets

CONTINUOUS FLEXIBLE CHEMICALLY-MILLED CIRCUIT ASSEMBLY WITH MULTIPLE CONDUCTOR LAYERS AND METHOD OF MAKING SAME

BACKGROUND OF THE INVENTION

1. Field of the Invention

The present invention is directed to a multilayer chemically-milled circuit assembly. It is more particularly directed to a method of manufacturing a multi-layer circuit assembly in a continuous process. During the course of the process, an interim step includes the application of the conductive patterns to both sides of a flexible film carrier prior to a final etching step which fully develops the circuitry.

2. Description of the Related Arts

Double-sided (two conductor layers) and Multi-layer printed circuit boards (more than two conductor layers), as the terms have come to be known in the art, are used extensively today in an effort to increase the interconnect density required by complex microelectronic systems. The most commonly used printed circuit assembly is a "double-sided" assembly having top and bottom metallic layers separated by a middle electrically insulating layer usually consisting of fiberglass-reinforced epoxy or any number of other polymer dielectric materials. The well known two-layer concept has been successfully modified by bonding multiple double sided printed wiring boards with partially reacted glass-epoxy insulating layers. Current art encompasses many multilayer printed wiring board process variations. Some of these variations involve the interconnecting vias or plated-thru holes while yet other variations involve the sequence of outer layer photolithography and etching. Regardless of the specific multilayer printed wiring board process, it is generally acknowledged that multiple layers exact cost and quality penalties but provide the necessary advantage of increasing functionality and component density.

Another type of two conductor layer circuit board may be considered in which both the top and bottom layers have conductor patterns formed on a middle metallic layer which are connected through the use of "air bridges" by selectively etching portions of the middle layer. The bottom layer, in turn, is typically affixed to a base material such as, for example, an epoxy glass substrate, generally referred to as FR4, or an aluminum base plate having a dielectric layer to prevent shorting or any two or three dimensional solid material with an electrically insulating surface.

A process for manufacturing such two-layer chemically-milled printed circuit boards is shown in substantial detail in U.S. Pat. No. 4,404,059 issued to Livshits et al. Livshits teaches that conductor patterns may be formed into a double-sided printed circuit board through the use of an additive procedure referred to in the art as "RITM." As disclosed, conductor metal is electroplated onto opposed major surfaces of a substantially planar metal substrate through respective protective masks which correspond to the desired conductor pattern. The protective masks are typically photoresists which are applied by known two-side photolithography over the metal substrate. The conductor pattern on the first major surface includes bridging elements having enlarged ends and a constricting portion therebetween. The conductor pattern on the opposed major surface includes elements oriented transversely to the bridging elements.

After the outer conductors are electroplated on the middle metallic layer, the protected masks are removed and following a pre-etching step, an adhesive layer comprising an insulated material is secured to one major surface of the plated substrate such that it becomes embedded in one major surface of the adhesive layer. The other major surface of the adhesive layer is thereafter secured to a base. The entire substrate is then immersed into an etchant for a sufficient period of time to remove exposed portions of the substrate below the constricted portions of the bridging elements throughout the entire thickness of the substrate.

Livshits et. al. suggests that a double-sided printed (two conductor layers) circuit board may also be formed by selectively removing conductor metal pre-applied over the entire surface of the substrate with the advantage that pre-fabricated bimetallic laminates prepared by metallurgical cladding techniques may be used. Livshits cautions, however, that the resulting conductors will suffer from the irregularity of edges and low produceability of shape. Accordingly, the additive technique discussed above is proclaimed as more efficient from the standpoint of conductor metal consumption as well as the attainment of higher density of the conducting pattern of the panel.

Another method of manufacturing two-layer chemically-milled circuit boards is shown in U.S. Pat. No. 3,801,388, issued to Akiyama et al. Akiyama et al. is similar to Livshits et al. except that the process starts with a tri-metel clad structure in which a metal such as copper is clad on both sides with a metal having substantially different etch characteristics such as nickel. The tri-metal layer is coated with a resist coating which is exposed and developed. The nickel is defined into the eventual circuit traces by using the photoresist as an etch resist. The remainder of the process is the same as that already described.

The Livshits et al and the Akyiama patents may be viewed as "additive" and "subtractive" variants of the same basic chemically-milled circuit process in that both processes result in substantially the same two-layer chemically milled interconnect construction. The resulting two conductor layer circuit structures are dominated by air bridge conductor cross-over and solid pedestals which are quite different in appearance to traditional printed circuit board features.

Among the difficulties with both the two-layer laminated printed circuit board and two conductor layer chemically-milled processes described above are the cost and size of the resulting circuit board. The conductor patterns are fixed to a rigid substrate (circuit board) prior to etching. Use of the rigid board has required a batch that both increased the cost and size of the resultant circuit. With increased interconnect density requirements (higher electrical functionality in a smaller volume) such two-layer chemically-milled circuit approaches have only limited utility. A need exists for low cost, flexible multi-layer (more that two) chemically milled circuitry. Since both layers of this construction are necessary for X and Y conductor routing, there is no provision in either the Akyiama or the Livshits constructions for EMI or RF shielding, nor higher interconnect densities required on fine pitch devices. There is also a practical limitation of the outer metal thickness which may be used on the two-layer construction. Thinner outer metal layers are required for finer resolution while precluding high currents due to inherent conductor resistive heating. The common requirement, especially in automotive electronic packaging, of mixed power/logic functionality limits the practical utility of two-layer chemically-milled circuit approaches Some attempt to manufacture flexible circuits are shown in U.S. Pat. No. 4,659,425, issued to Eggers et al. Eggers et al. shows a continuous method of manufacturing a circuit assembly. A resin is applied to the surface of a metal foil. The resin coated foil is contacted with a reinforcing cloth in a double belt press. The method produces a double sided circuit. The double belt process is relatively slow and requires a large amount of floor space. It is primarily directed to laminating a reinforcing cloth to a film and does not enable the use of extruded film between the metal foils.

There are numerous other known flexible circuit processes. The majority involve the use of a flexible polymer dielectric barrier between all conductor layers and traditional electrical interconnection techniques. These technologies, due to the expensive materials used and the large number of process steps are prohibitively expensive. Existing flexible circuit process complexity and expense preclude the practicality of continuous multilayer manufacturing schemes.

These deficiencies and problems are overcome by the present invention.

SUMMARY OF THE INVENTION

It is an object of the present invention to provide a method of manufacturing an improved multi-layer chemically-milled circuit assembly having two or more conductor patterns. The method includes providing a first major tri-layer having a first metal surface a second major tri-layer having a second metal surface. A thin flexible carrier is placed between the first and second layers. Each of the major layers are, in turn, composed of a trimetal sandwich A/B/A constructione. The outer "A" metal layer from each of the major layers are either additively or subtractively defined in the manner or Livshitz or Akiyama such that a contiguous metal foil B contained defined areas of metal A on both major surfaces. The first and second major layers are subsequently attached to opposite surfaces of the carrier resulting in a A/B/A/C/A/B/A construction. The central layer (layer "B") from each of the first and second predefined tri-metal sandwiches are preferentially etched to simultaneously four circuit interconnection layers. The "C" layer is the flexible carrier. The conductor patterns form the electrical traces interconnecting components on an electronic circuit assembly. The first and second conductor patterns are electrically connected to form an electronic circuit assembly that includes electronic traces on both sides of the circuit board.

In the preferred method of practicing the present invention, the first and second metal layers are formed as a tri-metal laminate etching layer having a first major surface, a middle layer having a predetermined thickness, and a bottom layer forming a second major surface opposed to the first major surface. Each of the tri-metal layers comprises material etchable in a respective given etchant. Conductor patterns are thereafter etched on both the first and second major surfaces by disposing respective etch resists (photoresists), each corresponding to a reverse image of a desired conductor pattern. Thereafter, the first and second major surfaces are etched in the given etchant to form the first and second conductor patterns. The first and second etch resists are then removed.

According to the invention, a flexible carrier layer is placed between the first and second metal layers and secures the assembly. The carrier may be a thermoplastic, thermoset adhesive or a dielectrically-coated metal foil. In practice, the central flexible carrier layer may be any solid material with an outer insulating major surfaces. The carrier transports the metal layers through the etching and laminating process. The first and second conductor patterns are interconnected to form a circuit assembly.

In carrying out the above method, a dual-layer printed circuit assembly is formed which is adapted to provide a high concentration of attachment location for electronic components.

The printed circuit assembly comprises a laminate substrate hatting a top layer, a middle layer and a bottom layer. The top layer forms a first major surface having a first conductor pattern formed thereon. The bottom layer forms a second major surface opposed to the first major surface and having a second conductor pattern formed thereon. The middle layer comprises a plurality of interconnect regions or thermal posts which separate isolated portions of the first and second surfaces. Alternate interconnection schemes and constructions are feasible including edge connection from metallurgical bonding, brazing, welding or soldering of overhanging metal structures or by the use of discrete conductive clips. Pre-perforated dielectric or metallic carrier sheets may also be used with subsequent alignment and electrical connection accomplished through the sites of the carrier perforations and juxtaposed conductive circuit pads by a variety of methods. Other similar examples to accomplish layer-to-layer interconnection exist.

The laminate substrate further includes a compliant adhesive layer usually comprised of a low modulus material having a first major surface secured to the second major surface of the substrate, and a second major surface. Finally, the printed circuit assembly includes a base, typically, but not necessarily, a plastic substrate, having a first major surface secured to the second major surface of the adhesive layer. Again, in keeping with the invention, the height of the thermal posts and the low modulus material of the adhesive layer are selected and combined so as to provide said reduced interfacial stresses as well as stresses on eventual component solder joints.

The flexible carrier material selection is critical to the reliability of the final electronic assembly. Carriers with high linear coefficients of thermal expansion (over 20 ppm/C) need substantial mechanical de-coupling from the chemically milled circuit through the use of compliant low-modulus adhesives. Lower linear coefficient of thermal expansion carrier materials (under 20 ppm/C) are preferred and allow increased adhesive se ection latitude.

These and other objects, features, and advantages of the present invention will become more readily apparent when viewed in connection with the accompanying drawings wherein like reference numerals correspond to like components.

DETAILED DESCRIPTION OF THE PREFERRED EMBODIMENTS

Figure 1:
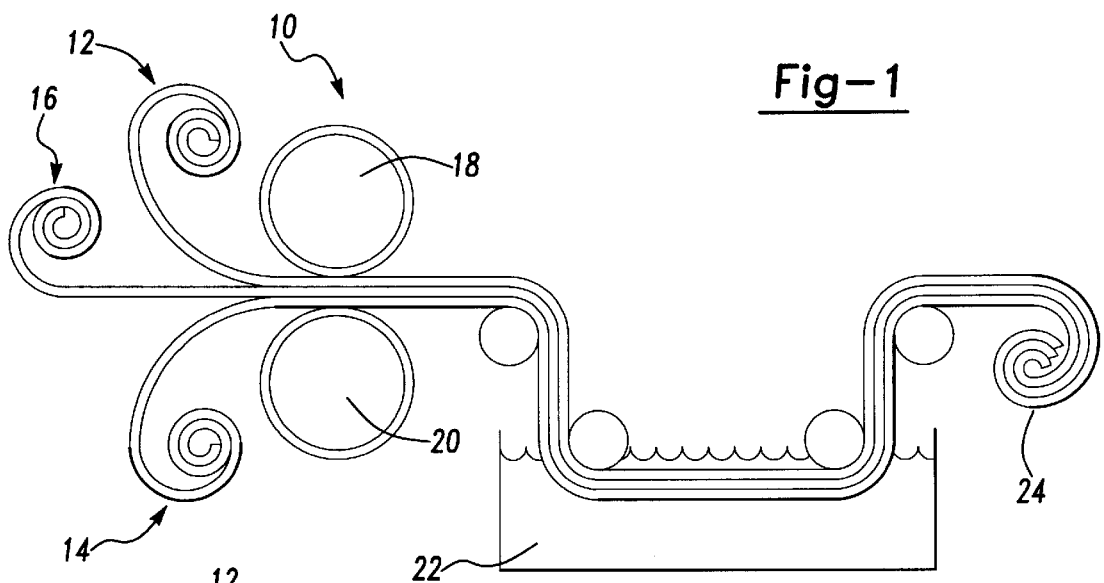
FIG. 1 is a schematic diagram illustrating the manufacturing steps of the present invention using a thermoplastic film carrier

The present invention will be described through a series of drawings, which illustrate a continuous manufacture a circuit assembly having two tri-metal layers attached to both surfaces of a carrier. It is also possible to practice the present invention is a batch mode with various sheets of material are stacked and laminated. Other items such and single sided circuits or dual sided single layer tracings may be manufactured using the same or similar technique and equipment and are included within the invention described herein. The following items are a word list of the items described in the drawings and are reproduced to aid in understanding the invention:

| | |
|---|---|
| 10, 10', 10" | apparatus |
| 12 | partially etched tri-metal layer |
| 14 | partially etched tri-metal layer |
| 15 | flexible circuit |
| 16, 16' | film carrier |
| 16" | metal foil carrier |
| 16''' | carrier with rigid panels |
| 16'''' | film carrier |
| 18 | calendaring roller |
| 20 | calendaring roller |
| 22 | etching bath |
| 24 | coil |
| 26, 26' | adhesive |
| 28 | roll coater |
| 30 | roll coater |
| 32, 32' | circuit assembly |
| 34 | copper layer |
| 36 | aluminum layer |
| 38 | air bridges |
| 40 | metal foil |
| 42 | dielectric coating |
| 44 | passage |
| 46 | conductive material |
| 48 | rivet |
| 50 | pin |
| 52 | solder joint |
| 54 | tabs |
| 56 | conductive joint |
| 58 | perforated carrier |
| 60 | perforations |
| 62 | conductive material |
| 64 | soldered pin |
| 66 | rigid panels |
| 68 | blade |
| 70 | circuit boards |
| 72 | conductive traces |

Referring to FIG. 1 of the drawings, there is shown a schematic diagram illustrating the various manufacturing steps of the present invention. An apparatus 10 is used to manufacture a circuit assembly. Apparatus 10 includes feed stock of coiled metal layers 12,14. The metal layers 12, 14 may be either a single layer of metal that may be formed into conductor traces, or more preferred, the metal layers 12, 14 are each two or more metal layers that may be partially etched to form a densely packed circuit assembly. Most preferred are tri-metal laminates made of two outer layers and an intermediate support Layer. An example of this construction is illustrated in commonly assigned U.S. patent application titled: "A multi-layer printed circuit board and method of making same", Ser. No. 08/786,494, filed Jan. 21, 1997, and incorporated herein by reference.

Circuitry patterns are applied to the metal layers 12, 14 by either an additive or subtractive photodefinition method. In general, the inner metal layer of the tri-metal laminate is more susceptible to etching. This inner layer is in metal layers 12, 14 and is subsequently removed after lamination. This inner layer serves to strengthen the metal layers 12, 14 to withstand a calendaring process that will be described is greater detail below. Suitable tri-metal laminates are made from Cu/Al/Cu sandwich structures. Other combinations of metals are also suitable for use in this invention including Cu/Ni/Cu and Ni/Cu/Ni. The tri-metal layers generally have dimensions of 50 $\mu$m/150 $\mu$m/50 $\mu$m.

The metal layers 12, 14 are bonded to a film carrier 16. The film carrier 16 may be either a dielectric material such as plastic or alternatively, film carrier 16 may be a metal foil that is coated with a dielectric coating. Polymer and insulated metal matrix composite or other solid materials with non-electrically conducting surfaces may be used. Illustrated in FIG. 1 is a film carrier 16 made from a thermoplastic film. Suitable thermoplastic films include poly (ethylene terapthlate (PET or Mylar™), and poly (etherimide) (Ultem™) having a thickness ranging from 75–500 $\mu$m. The film carrier 16 is placed between the metal layers 12, 14 and passed between calendaring rollers 18, 20. The rollers 18, 20 are heated and soften the film carrier 16 between the metal layers 12, 14. Shown for purposes of illustration is a pair of opposed rollers 18, 20, but multiple calendaring rollers may be used to heat and laminate the film carrier 16 between the metal layers 12, 14. Some central carriers require the use of a separate interposing adhesive layer to effect bonding to the circuit layers as will be more fully described below.

After the laminate has passed through the calendaring or heated roll lamination process, it is emmersed in one or more etching baths 22. The etching bath 22 removes one or more of the tri-metal laminate layers. Generally, the etching bath removes an inner metal layer of aluminum or nickel to expose air bridges in the metal layers 12, 14. When the metal layers 12, 14 are made from a single layer of metal, the etching bath 22 removes excess metal to leave conductor traces for the circuit assembly. The composition of the etching bath 22 is selected to remove the metal used on the metal layers 12, 14 as are commonly used in electronic circuit manufacturing. After the laminate is etched, it is washed and dried and rolled into coils 24 for storage or transport. Alternatively, the laminate may be cut into sheets and fabricated into electronic circuits.

The invention thus described provides a continuous method of manufacturing a circuit assembly from separate metal layers and a separate carrier layer. The lamination, etching and drying stages all may occur without removing the laminate from the apparatus 10. After the circuit assembly is completed it is removed from the apparatus 10 as a coil 24 and then formed into electric circuits.

Figure 2:
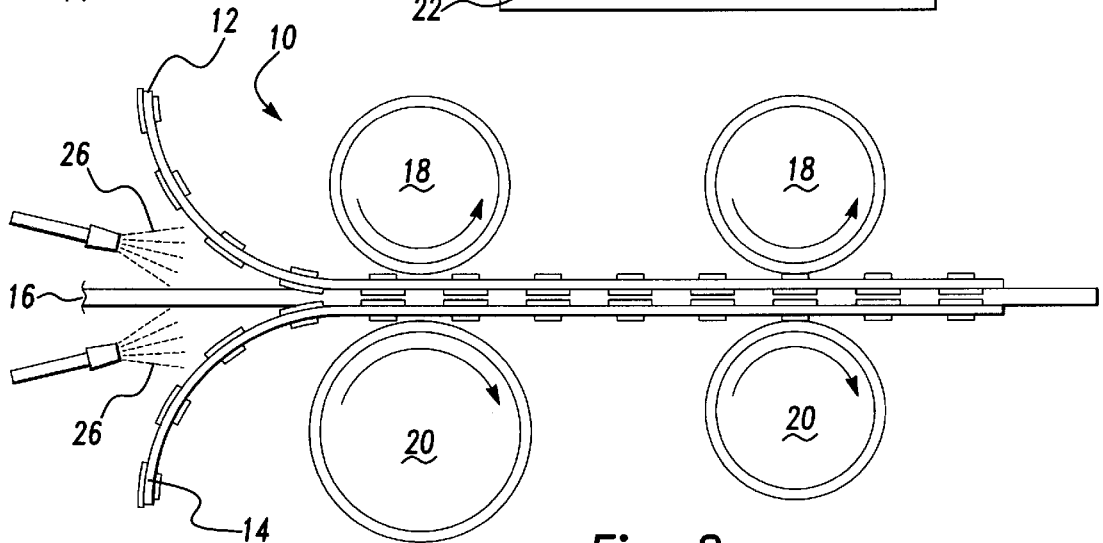
FIG. 2 is an alternative embodiment of the present invention using a spray adhesive and film carrier.

The invention as thus described uses an intermediate thermoplastic film carrier. Other types of materials are also suitable. Illustrated in FIG. 2 is an apparatus 10' having a film carrier 16' that is made from an extruded sheet of poly (etherimide) material. An adhesive 26 is applied to film 16'. The adhesive 26 adheres the film 16' to the metal layers 12, 14 and may eliminate the need to heat the rollers 18, 20. The rollers 18, 20 compress the film 16' between the metal layers 12, 14 to form a laminate. The remainder of the process is the same as that described above.

Figure 3:
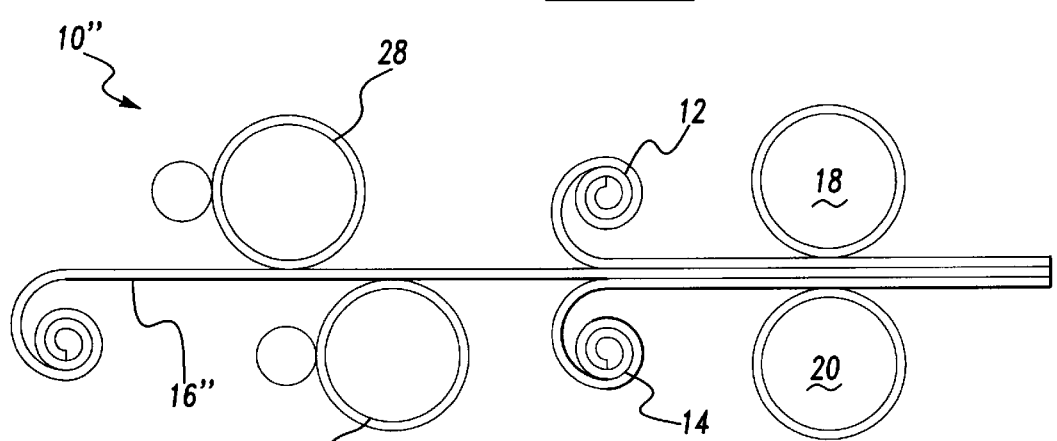
FIG. 3 is another alternative embodiment of the present invention using a coated metal film carrier.

Another embodiment of the present invention is illustrated in FIG. 3. The carrier 16" is made from a metal foil such as stainless steel or epoxy-coated mild steel having a thickness of about 150 microns. Using a metal foil as the carrier layer has several advantages. The metal may act as a ground plane for the circuit assembly and provide the resultant electronic device with EMI and RMI shielding. When using a metal foil as a carrier, the metal foil must be coated with a dielectrical material to provide electrical insulation. The metal foil may be pre-coated or the apparatus 10" may also include roller coaters 28, 30 to apply a dielectric coating to the carrier 16". Suitable dielectric coatings include generic epoxy, polyurethane or any other electrically insulating polymer material able to withstand subsequent processing and environmental conditions. The dielectric coating may be applied using roll coaters 28, 30. Suitable roll coating applicators include direct and reverse coaters. When the dielectric coating applied is a thermoplastic adhesive, no further materials are needed to adhere the carrier 16" to the metal layers 12, 14. The rollers 18, 20 laminate the circuit assembly together.

Figure 4:
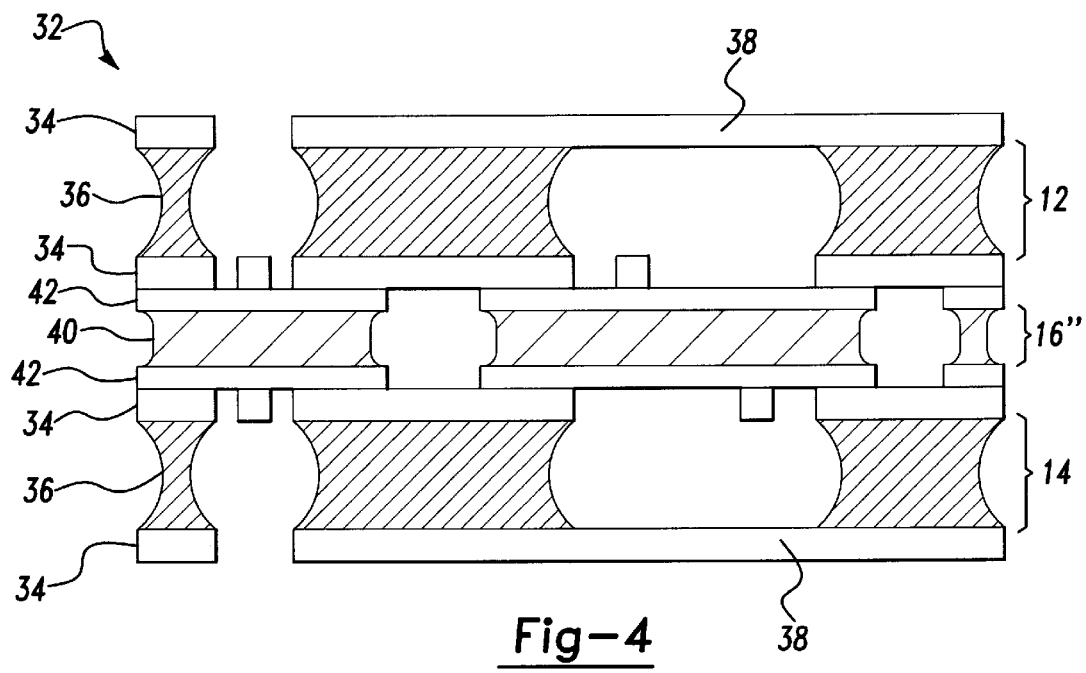
FIG. 4 is an enlarged cross-sectional view of a circuit assembly made using the invention.

An example of the circuit assembly made using the method described is illustrated in FIG. 4. The circuit assembly 32 comprises two etched tri-metal layers 12, 14. The layers 12, 14 are made from two copper layers 34 and an inner aluminum layer 36. This construction is useful for making tightly spaced circuit assemblies having air bridges 38.

The metal layers 12, 14 are bonded to the carrier 16". The carrier 16" includes a metal foil layer 40 and a dielectric coating 42. The dielectric coating 42 bonds the foil layer 40 to the metal layers 12, 14. A similar construction is used for carriers made of thermoplastic film or adhesive.

The metal layers 12, 14 may be interconnected. Different types of interconnections are possible including edge connectors that wrap around the edge of the circuit assembly 32. More preferred are interconnections through the carrier 16, 16' and 16".

Figure 5:
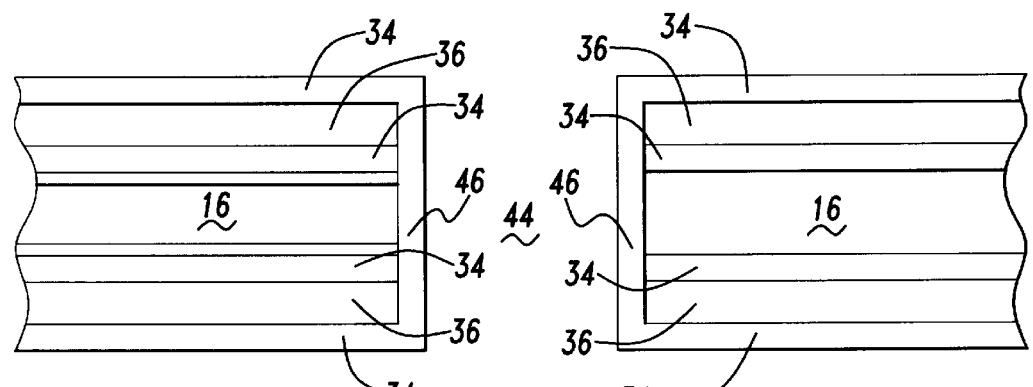
FIGS. 5–7 are cross-sectional views of alternate methods of interconnecting the various layers.
Figure 6:
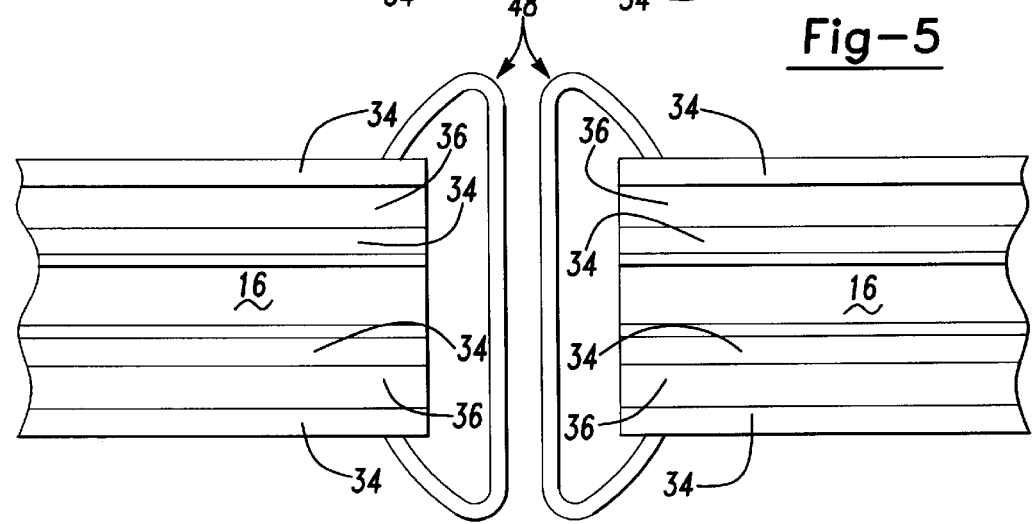
Figure 7:
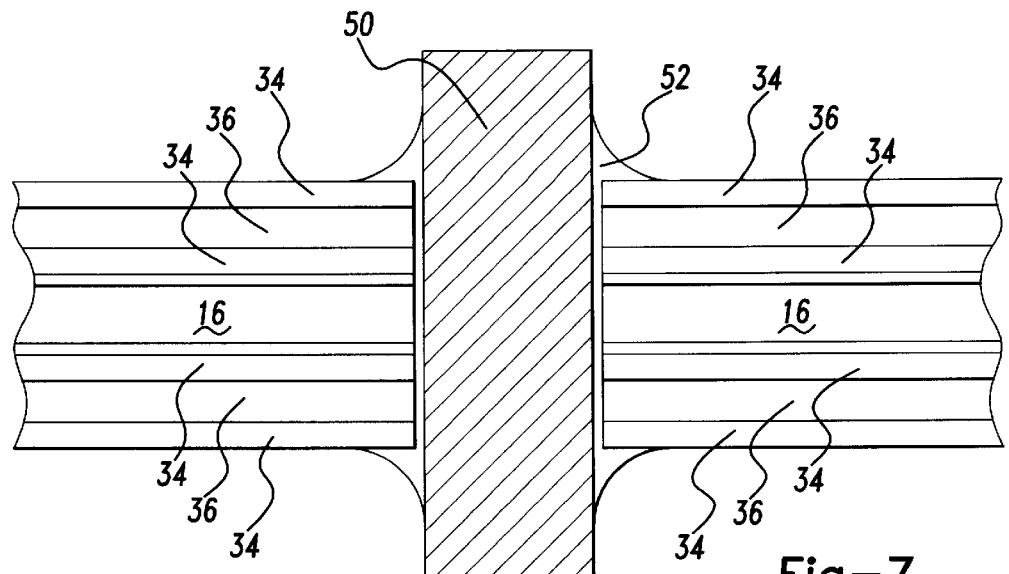

The interior electrical connection between the circuitry on both sides of the insulating carrier is brought about by a number of methods including, but not limited to, conventional circuit hole drilling and plated thru-hole processing and its variations, hole drilling and riveting. FIGS. 5–7 show the plated thru hole, rivet/clip, and soldered pin variations respectively, all involving a drilled or punched hole entirely through the bonded multilayer chemically milled circuit following final etching. FIG. 5 illustrates the plated-thru hole approach in which a passage 44 is drilled through the entire multilayer structure and subsequently activated, and plated with a conductive material 46 to form a conductive path between all conductive layers of the circuit assembly 32. Obvious variations to this approach include filling the plated or unplated hole with metal or filled polymer material to allow electrical conductivity between layers. FIG. 6 illustrates the approach involving a mechanically-formed hole followed by inserting an expandable riveted 48 between outer conductive layers. This rivet 48 can be metallurgically or adhesively bonded as an additional step. FIG. 7 shows the interconnection variation in which a mechanically drilled hole is filled with a pin 50 which is then soldered 52 to the outer conductive surfaces of the circuit assembly 32.

Figure 8:
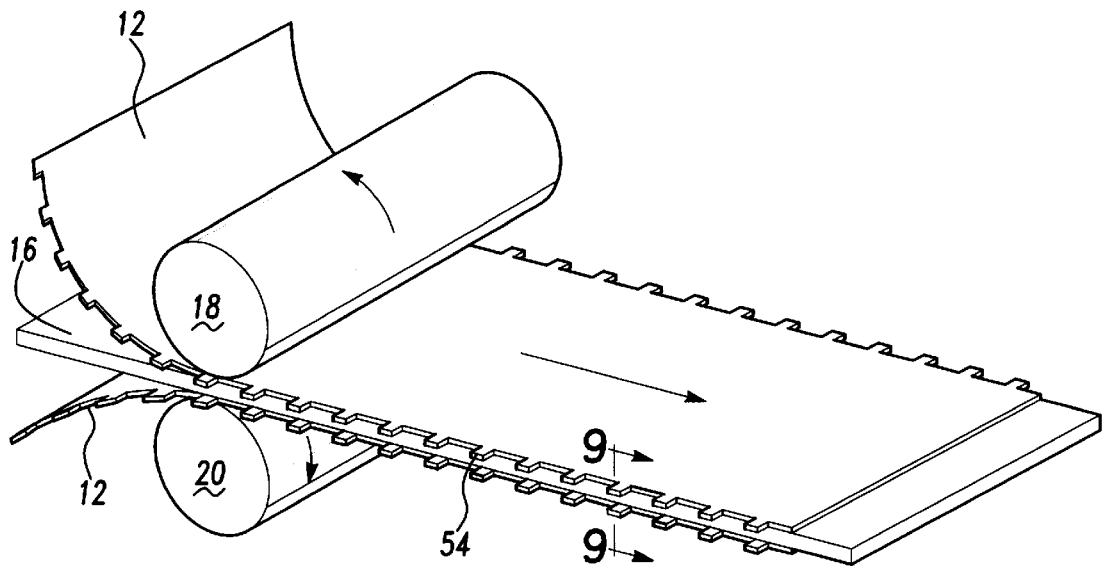
FIG. 8 is a schematic diagram illustrating an edge connection for interconnecting the various layers.
Figure 9:
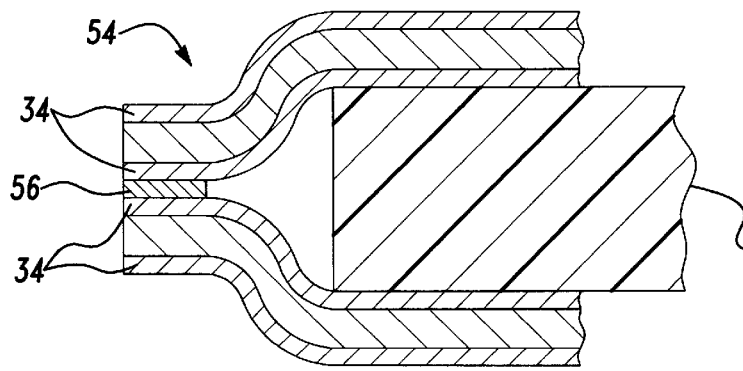
FIG. 9 is a detailed cross-sectional view of the line 9—9 in FIG. 8.

An alternate interconnection involves soldering, welding or joining lateral extensions of adjacent trimetal from both sides of the dielectric carrier film with an electrically conductive material. This variation is represented in FIGS. 8 and 9. The relevant region of the multilayer flexible chemically-milled circuit from FIG. 8 is expanded in FIG. 9. Conductive overhang tabs 54 protruding from either or both edges of the continuously processed flexible chemically-milled circuit web are juxtaposed and conductively joined 56 through any number of known processes including, but not limited to, seam welding, soldering, brazing, or the use of interposing conductive materials including metal-filled polymers.

Figure 10:
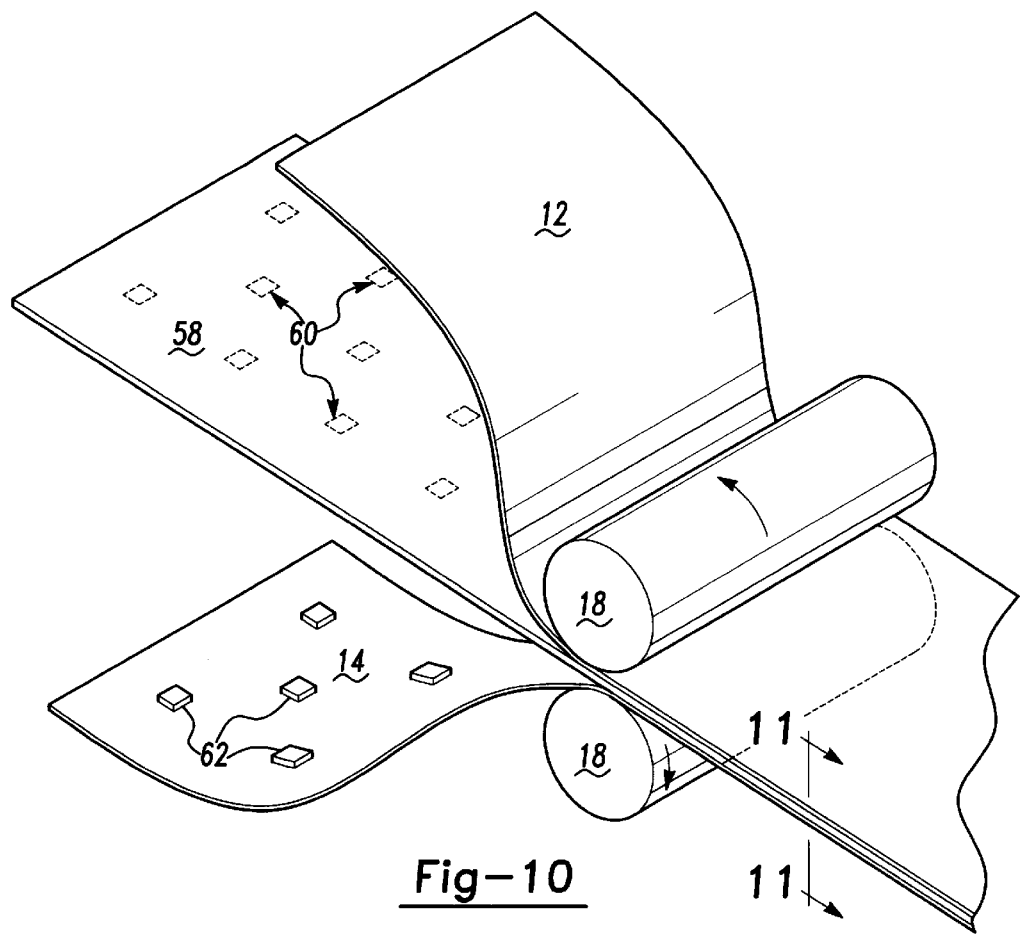
FIG. 10 is a schematic diagram illustrating an alternative edge connector construction.
Figure 11:
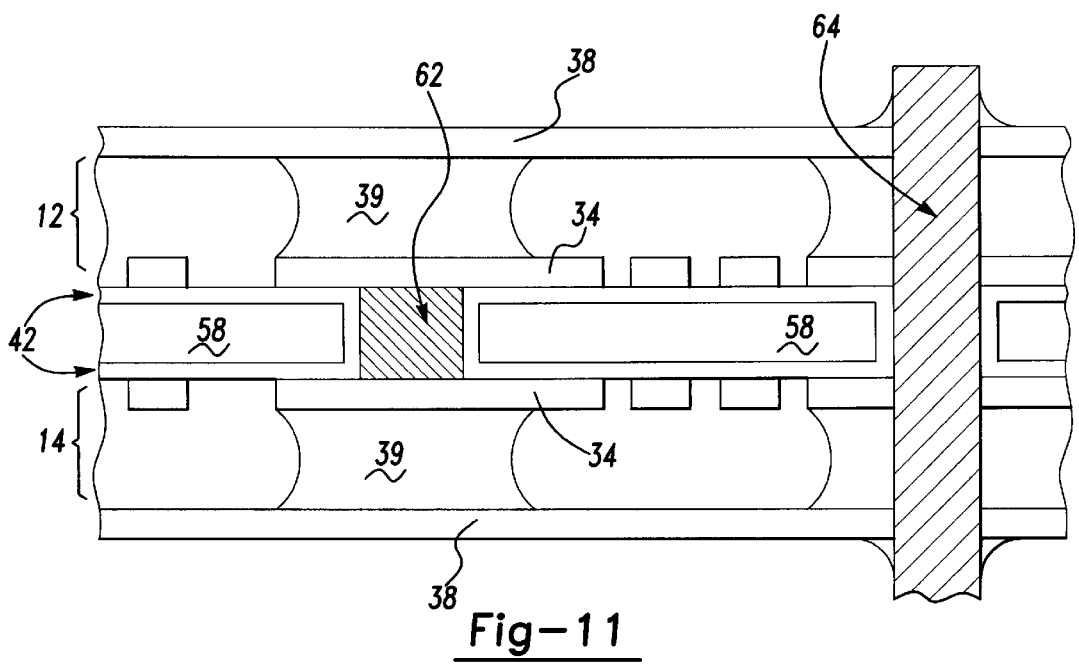
FIG. 11 is a detailed cross-sectional view of the line 11—11 in FIG. 10.

Yet another method of interconnecting conductor layers is shown in FIG. 10. In this example, the central dielectric carrier 58 is perforated 60 and aligned between adjacent areas of both sides of the partially etched chemically-milled circuit structures as shown in FIG. 11. The actual electrical interconnection is accomplished through direct contact of the layers 12, 14 with a conductive material 62. The perforated areas 60 align with the conductive material 62. The conductive material 62 includes solder, conductive adhesive or a metal pad. Alternatively, the conductive material 62 may be added after the lamination process.

The use of a perforated carrier 58 requires precise alignment of all layers during the bonding process. This alignment is accomplished by numerous methods including the use of index or ratchet holes corresponding to feed gears on the hot roll lamination station. Alternative machine vision and mechanical alignment methods may be used.

It should be recognized that the above techniques may also be combined to provide electrical interconnection between layers of the flexible multilayer chemically-milled circuit. For example, a perforated dielectrically coated metal carrier 58 may be aligned and laminated as described above. The sites of the perforations 60 in the flexible carrier 58 correspond to sites of eventual electrical interconnection metal layers 12, 14. Following final etching, holes are formed through the layers 12, 14 drilling, punching or other process at locations corresponding to the perforations 60. The diameter of these holes is less than the size of the perforation 60 to prevent circuit shorting. Pins 64 are placed and soldered in the drilled holes to complete the connection as shown in FIG. 11. These pins 64 may also be insulated to provide added protection from shorting to the metal carrier 58.

Figure 12:
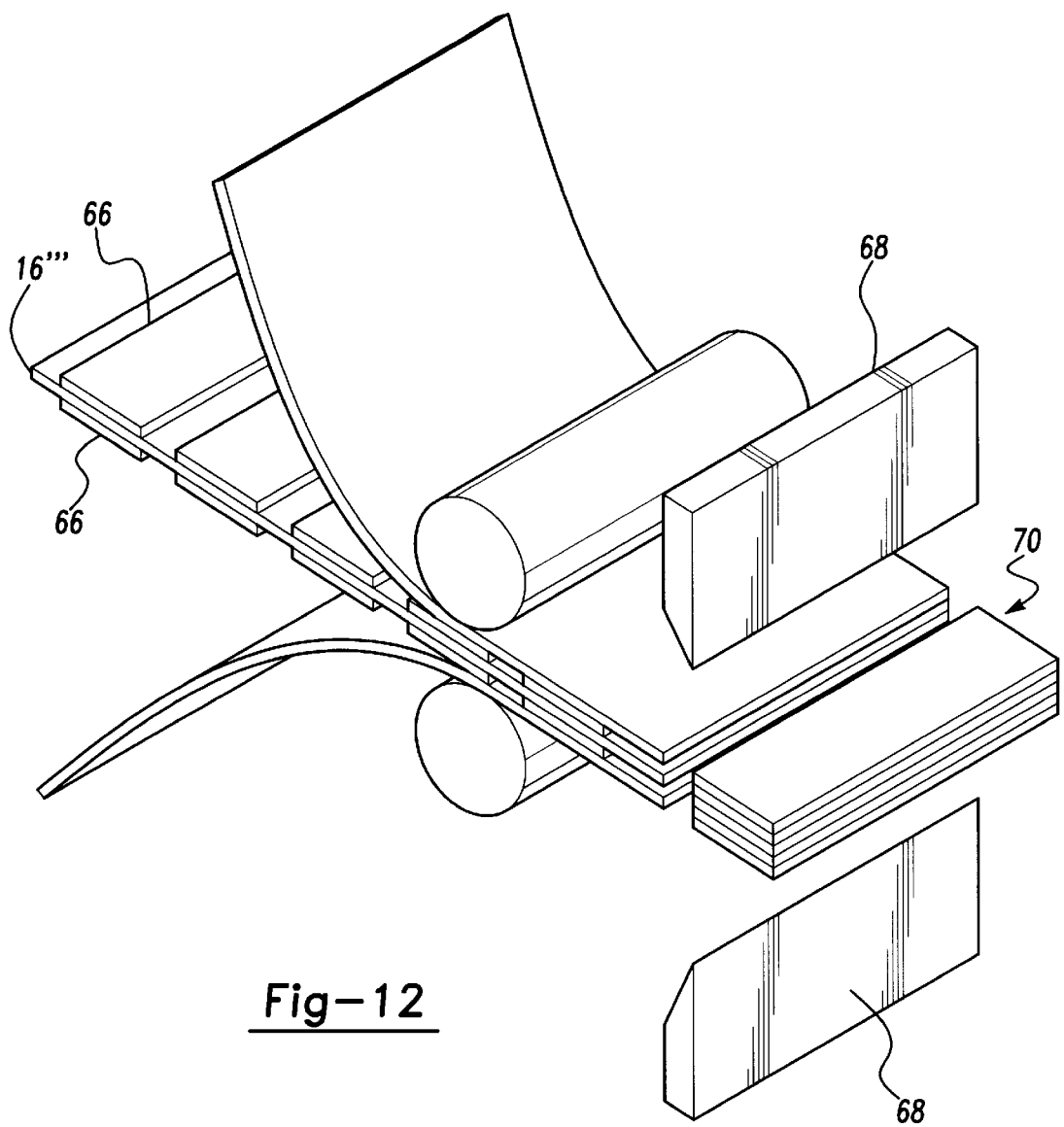
FIG. 12 is a schematic diagram illustrating yet another alternative embodiment of the present invention having regularly spaced rigid panels affixed to the carrier.

In yet another alternative embodiment of the invention, the carrier 16''' includes a series of regularly spaced rigid panels 66 that extend transversely to the carrier 16''' as shown in FIG. 12. The rigid panels 66 provide a rigid backing for the tri-metal layers 12, 14. The rigid panels 66 may be used in high vibration applications or when the size or number of airbridges on the circuit assembly 32 require more support than is available with a flexible carrier. The rigid panels 66 are made from plastic or metal plaque attached to a continuous carrier layer. The carrier 16''' may still be rolled into coils and processed using the continuous machining apparatus described because it may flex between the rigid panels. After the tri-metal layers 12, 14 are attached and etched, the carrier 16''' and the layers 12, 14 are cut by blades 68 into boards 70.

Figure 13:
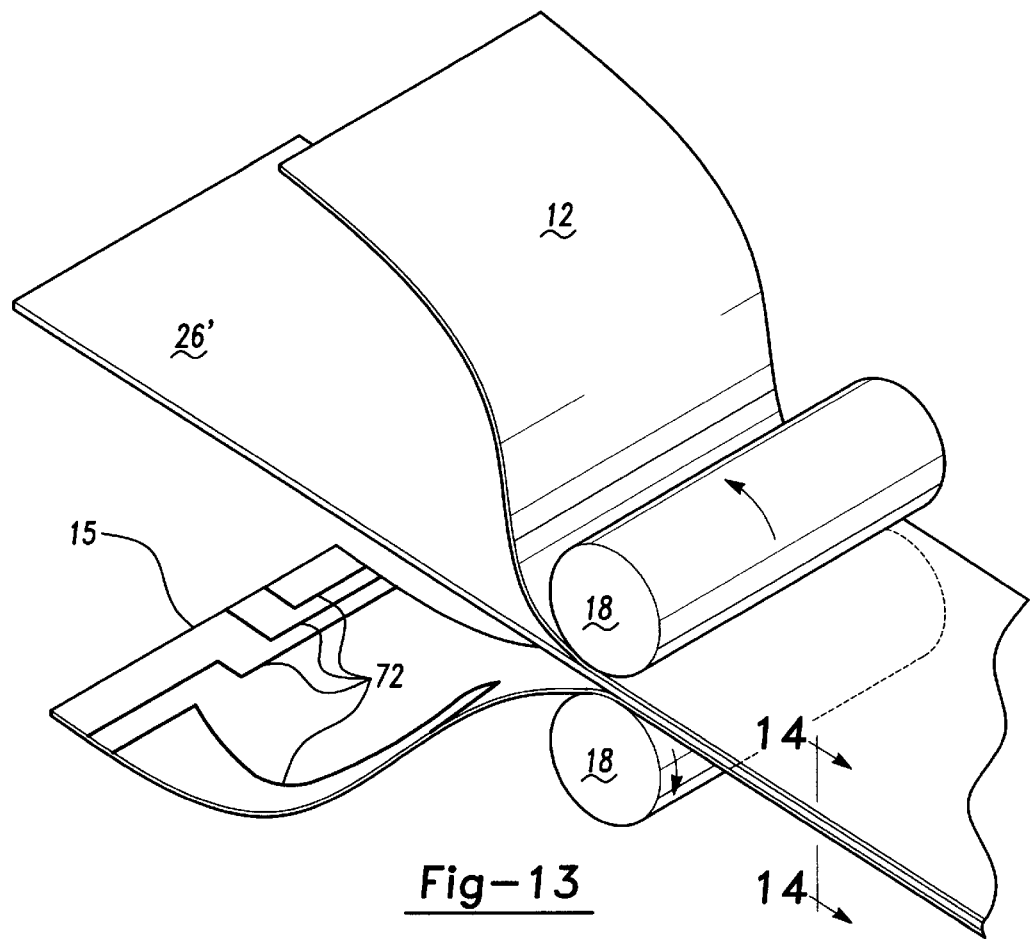
FIG. 13 a schematic diagram illustrating yet another alternative embodiment of the present invention attaching an ETM layer to a flex circuit.
Figure 14:
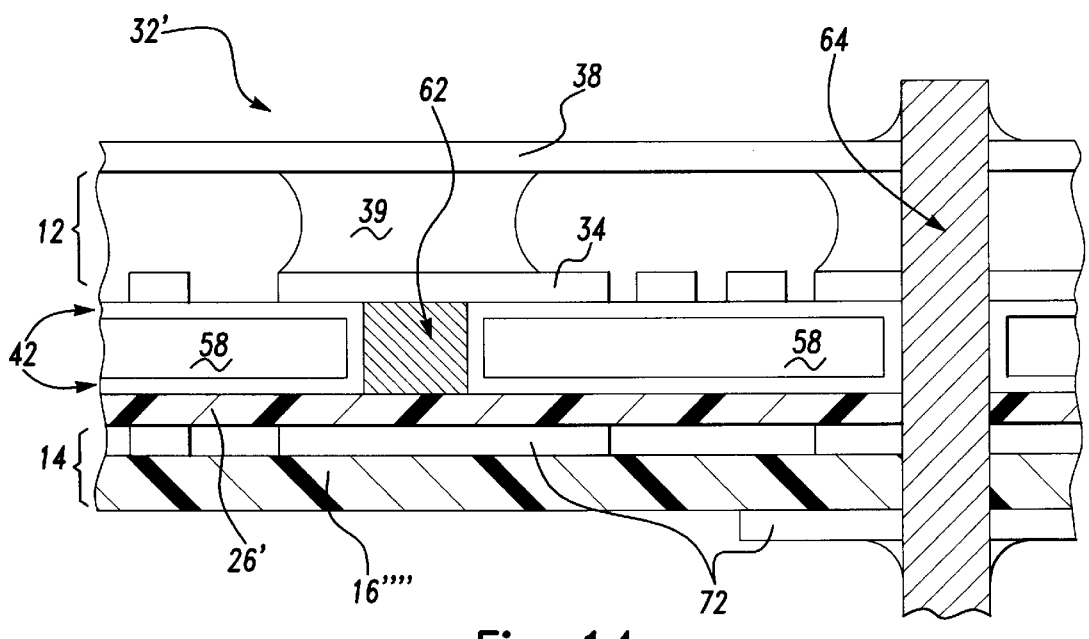
FIG. 14 is a detailed cross-sectional view of the line 14—14 in FIG. 13.

In still another embodiment, the methods taught above may be adapted to form a circuit assembly having one side made from a tri-metal layer and a second side made from a flexible cr rigid circuit layer. FIGS. 13–14 illustrate attaching a tri-metal layer 12 to a two-sided flex circuit 15. The flex circuit 15 is constructed from a flexible film carrier 16'''' having conductive traces 72 on both surfaces of the carrier 16''''. The tri-metal layer 12 is aligned atop the flex circuit 15 and bonded thereto using an adhesive sheet 26'. The bonded circuit assembly 32' is processed in an etching bath as described above. A soldering pin 64 electrically connects the tri-metal layer 12 to the flex circuit 15.

The flex circuit 15 may also be replaced with a wide variety of circuits including single, double and multilayer flexible circuits. These circuits may result from either additive, semi-additive, or subtractive processing and may be composed of numerous electrical conductive materials such as copper or nickel and may be separated by numerous electrically insulative materials such as polyester or polyimide polymers.

The invention has been described as a method of attaching two etched tri-metal layers. Single or double metal layers may be used to form double sided circuit assemblies. Single sided circuit assemblies with a carrier film may also be fabricated using the method and apparatus described.

The invention has been described as a continuous method of manufacturing circuit assemblies using flexible coiled stock. Glass reinforced printed wiring boards may be used in a continuous process if they are made sufficiently flexible to be processed using the equipment described above. It is also possible to use the same methods taught herein to manufacture the circuit assemblies in a batch process where individual sheets of the various layers are bonded together in a vertical or horizontal press. This batch process may utilize rigid glass reinforce printed wiring boards because they need not bend in the roll presses.

While the best modes for carrying out the invention have been described in detail, those familiar with the art to which this invention relates will recognize various alternative designs and embodiments for practicing the invention as defined by the following claims.

What is claimed:

1. A method of manufacturing a continuous printed circuit assembly having at least two conductor patterns, comprising:

providing first layer having a first metal surface and a second layer having a second metal surface;

providing a thin flexible carrier between said first and second layers, said carrier having at least a first surfacing having rigid panels extending transversely to said carrier and said carrier being flexible between said rigid panels, said first layer being attached to said rigid panels;

attaching said first and second layers to opposite surfaces of said carrier;

etching said first and second metal surfaces to form first and second conductor patterns; and electrically connecting said first and second conductor patterns.

2. The method of claim 1, further comprising severing said first and second layers and said carrier between said rigid panels.

* * * * *